(12) United States Patent
Konovalov et al.

(10) Patent No.: US 10,091,905 B1
(45) Date of Patent: Oct. 2, 2018

(54) DUAL-ACTION STORAGE MEDIA CHASSIS STRUCTURE AND SYSTEM

(71) Applicant: YANDEX EUROPE AG, Lucerne (CH)

(72) Inventors: Aleksandr Alekseevich Konovalov, Krasnogorsk (RU); Pavel Gennadievich Melnikov, Moscow (RU); Igor Urevich Znamenskii, Drozhzhino (RU); Ivan Vladimirovich Prostov, Moscow (RU); Andrey Olegovich Korolenko, Moscow (RU); Andrey Alekseevitch Blokhin, Moscow (RU)

(73) Assignee: YANDEX EUROPE AG, Lucerne (CH)

( * ) Notice: Subject to any disclaimer, the term of this patent is extended or adjusted under 35 U.S.C. 154(b) by 0 days.

(21) Appl. No.: 15/828,923

(22) Filed: Dec. 1, 2017

(30) Foreign Application Priority Data

Mar. 31, 2017 (RU) ................................ 2017110908

(51) Int. Cl.
*H05K 7/00* (2006.01)
*H05K 5/00* (2006.01)
*H05K 7/14* (2006.01)

(52) U.S. Cl.
CPC ......... *H05K 7/1489* (2013.01); *H05K 7/1487* (2013.01); *H05K 7/1492* (2013.01)

(58) Field of Classification Search
CPC ...................................................... H05K 7/00
(Continued)

(56) References Cited

U.S. PATENT DOCUMENTS

| 2007/0175836 A1 | 8/2007 | Bumeder et al. |
| 2013/0039004 A1 | 2/2013 | Li et al. |

(Continued)

FOREIGN PATENT DOCUMENTS

| CN | 201622520 U | 11/2010 |
| CN | 201757871 U | 3/2011 |

(Continued)

OTHER PUBLICATIONS

English Abstract of DE102013108217 retrieved on Espacenet on Jul. 4, 2017.

(Continued)

*Primary Examiner* — Jerry Wu
(74) *Attorney, Agent, or Firm* — BCF LLP

(57) ABSTRACT

A dual-action storage media chassis system comprising: a chassis and two storage media modules accommodated in the chassis. The chassis defining a central back storage space accommodating a processor unit having a third operating temperature. Each storage media module including: a tray frame, each tray frame including a top access opening; a first plurality of storage media (having a first operating temperature) arranged into a front portion of the tray frame through the top access opening; a second plurality of storage media (having a second operating temperature) arranged into a back portion of the tray frame through the top access opening; the front portion, the back portion and the central back storage space being disposed longitudinally sequentially in the dual-action storage media chassis system, such that the second operating temperature is superior to the first operating temperature, and the third operating temperature is superior to the second operating temperature.

12 Claims, 15 Drawing Sheets

(58) Field of Classification Search
USPC .................................................. 361/679.01
See application file for complete search history.

(56) References Cited

U.S. PATENT DOCUMENTS

| | | | |
|---|---|---|---|
| 2013/0043355 A1 | 2/2013 | Liang et al. | |
| 2013/0058028 A1 | 3/2013 | Lu et al. | |
| 2013/0100630 A1 | 4/2013 | Liang | |
| 2014/0204525 A1* | 7/2014 | Pecone | H05K 13/00 361/679.33 |
| 2015/0293566 A1 | 10/2015 | Ehlen et al. | |
| 2016/0219748 A1 | 7/2016 | Tsai et al. | |

FOREIGN PATENT DOCUMENTS

| | | | |
|---|---|---|---|
| CN | 102866744 A | 1/2013 |
| CN | 102981578 A | 3/2013 |
| CN | 204288088 U | 4/2015 |
| DE | 202007012718 U1 | 11/2007 |
| DE | 102013108217 B3 | 10/2014 |
| EP | 2252136 A2 | 11/2010 |
| RU | 166508 U1 | 11/2016 |

OTHER PUBLICATIONS

English Abstract of CN204288088 retrieved on Espacenet on Jul. 4, 2017.
English Description, Claims, Drawings of DE202007012718 retrieved on Espacenet on Oct. 25, 2017.
English Abstract of CN102981578 retrieved on Espacenet on Oct. 25, 2017.
English Abstract of CN102866744 retrieved on Espacenet on Oct. 25, 2017.
English Abstract of CN201757871 retrieved on Espacenet on Oct. 25, 2017.
English Abstract of CN201622520 retrieved on Espacenet on Oct. 25, 2017.
English Abstract of RU166508 retrieved on Espacenet on May 28, 2018.
Search Report with regard to the counterpart RU patent Application No. 2017110908 completed May 4, 2018.

* cited by examiner

US 10,091,905 B1

DUAL-ACTION STORAGE MEDIA CHASSIS STRUCTURE AND SYSTEM

FIELD OF TECHNOLOGY

The present technology relates to chassis structure, and more particularly, to a dual-action storage media chassis structure that facilitates access to and removal of storage media.

BACKGROUND

A server is a central computer that serves computers in a network environment and provides necessary functionalities to these network computers such as storage, processing, and exchange of information. Conventional servers may be implemented similarly to conventional personal computers and generally comprise a central processing unit(s) (CPU), a memory(ies) as well as input/output device(s) which are all communicatively coupled together internally via a bus. These internal components of the server or server hardware operate according to inherent specifications and may be influenced by external factors such as temperature, humidity, pressure and the like.

A single server may be composed of a plurality of server racks which accommodate the afore-mentioned server hardware. These server racks are generally arranged or stacked one over another in a compact manner and forming a server cabinet in order to minimize the room occupied by the server. The so-arranged server cabinet may be disposed in a factory, an engine room or any other location suitable for physical storage of the server cabinet. When more than one server cabinet is required for implementing a server, the more than one server cabinet are usually disposed one next to the other so as to minimize the room occupied by the server.

Due to the compact stacking or arrangement of the server racks and of the server cabinets, some of the components of the server may be difficult to access during maintenance or repair of the server. Additionally, the proximity of internal components may have an effect on the performance of the server due to heat generation and its influence on inherent specifications of the internal components.

SUMMARY

Embodiments of the present technology have been developed based on developers' appreciation that while the server racks arranged in a compact manner, the proximity of internal components of server racks may reduce their performance. Embodiments of the present technology have been developed based on developers' appreciation of at least one technical problem associated with the prior art solutions. Therefore, developers have devised a dual-action storage media chassis structure and system.

In accordance with a first broad aspect of the present technology, there is provided a dual-action storage media chassis structure, comprising: a chassis including: a partition corridor defined by two inner slide walls longitudinally extending in the chassis; two storage spaces symmetrically disposed on both sides of the partition corridor, respectively; and a central back storage space for accommodating a third-type of electronic component having a third operating temperature; two storage media modules accommodated respectively in the two storage spaces, each storage media module including: a tray frame, each tray frame including a top access opening, each tray frame for accommodating a second-type of electronic component having a second operating temperature in a back portion of the tray frame and for accommodating a first-type of electronic component having a first operating temperature in a front portion of the tray frame; two dual-action slide assemblies, each dual-action slide assembly including: a corresponding one of the two inner slide walls and a respective inner slide panel longitudinally extending in the chassis and attached to the respective tray frame, the corresponding one of the two inner slide walls adapted for slideably receiving the respective inner slide panel; each dual-action slide assembly for longitudinally and slideably moving the respective tray frame between a received position, a first withdrawn position and a second withdrawn position; the front portion of a given tray frame, the back portion of the given tray frame and the central back storage space being disposed longitudinally sequentially in the dual-action storage media chassis structure from the front end thereof to a back end thereof, such that the second operating temperature is superior to the first operating temperature, and the third operating temperature is superior to the second operating temperature.

In some implementation of the dual-action storage media chassis structure, each storage media module further includes a chain structure attached at one end to the respective tray frame and pivotably attached at the other end to the chassis in proximity to the central back storage space, the chain structure preventing the respective tray frame from being disconnected from the chassis.

In some implementation of the dual-action storage media chassis structure, each dual-action slide assembly is adapted to latch the respective tray frame in any one of the first and second withdrawn positions.

In some implementation of the dual-action storage media chassis structure, each dual-action slide assembly is adapted to lock the respective tray frame in the received positions.

In accordance with another broad aspect of the present technology, there is provided a dual-action storage media chassis system comprising: a chassis including: a partition corridor defined by two inner slide walls longitudinally extending in the chassis; two storage spaces symmetrically disposed on both sides of the partition corridor, respectively; and a central back storage space accommodating a processor unit having a third operating temperature; two storage media modules accommodated respectively in the two storage spaces, each storage media module including: a tray frame, each tray frame including a top access opening; a first plurality of storage media arranged into a front portion of the tray frame through the top access opening, each one of the first plurality of storage media having a first operating temperature; a second plurality of storage media arranged into a back portion of the tray frame through the top access opening, each one of the second plurality of storage media having a second operating temperature; the first and the second pluralities of storage media being electrically coupled to the processor unit, the front portion of the tray frame, the back portion of the tray frame and the central back storage space being disposed longitudinally sequentially in the dual-action storage media chassis system, such that the second operating temperature is superior to the first operating temperature, and the third operating temperature is superior to the second operating temperature; and two dual-action slide assemblies for longitudinally and slideably moving the respective tray frames between a received position, a first withdrawn position and a second withdrawn position, each dual-action slide assembly including a corresponding one of the two inner slide walls and a respective inner slide panel longitudinally extending in the chassis and attached to the respective tray frame, the corresponding one of the two inner slide walls adapted for slideably receiving the respective inner slide panel.

In some implementations of the dual-action storage media chassis system, the second plurality of storage media of a given storage media module is only accessible through the top access opening of the respective tray frame when the respective tray frame is in the second withdrawn position.

In some implementations of the dual-action storage media chassis system, the second plurality of storage media of a given storage media module is not accessible through the top access opening of the respective tray frame when the respective tray frame is in the first withdrawn position.

In some implementations of the dual-action storage media chassis system, the first plurality of storage media of a given storage media module is accessible through the top access opening of the respective tray frame when the respective tray frame is any one of the first and second withdrawn positions.

In some implementations of the dual-action storage media chassis system, each storage media module further includes a storage media combination frame attached to the respective tray frame and adapted for electrically coupling each one of the first plurality of storage media and of the second plurality of storage media arranged into the respective tray frame.

In some implementations of the dual-action storage media chassis system, each storage media module further includes a chain structure attached at one end to the respective tray frame and pivotably attached at the other end to the chassis in proximity to the central back storage space, the chain structure preventing the respective tray frame to be disconnected from the chassis.

In some implementations of the dual-action storage media chassis system, the first plurality of storage media and the second plurality of storage media of a given storage media module are latched differently to the respective tray frame.

In some implementations of the dual-action storage media chassis system, the dual-action storage media chassis system further includes two guiding assemblies, each guiding assembly cooperating with the corresponding dual-action slide assembly for moving the respective tray frame between the received position, the first withdrawn position and the second withdrawn position.

In some implementations of the dual-action storage media chassis system, the first operating temperature is about 50 degrees Celsius, the second operating temperature is about 70 degrees Celsius and the first operating temperature is about 95 degrees Celsius.

In some implementations of the dual-action storage media chassis system, each dual-action slide assembly is adapted to latch the respective tray frame in any one of the first and second withdrawn positions.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

These and other features, aspects and advantages of the present technology will become better understood with regard to the following description, appended claims and accompanying drawings where:

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Figure 10:
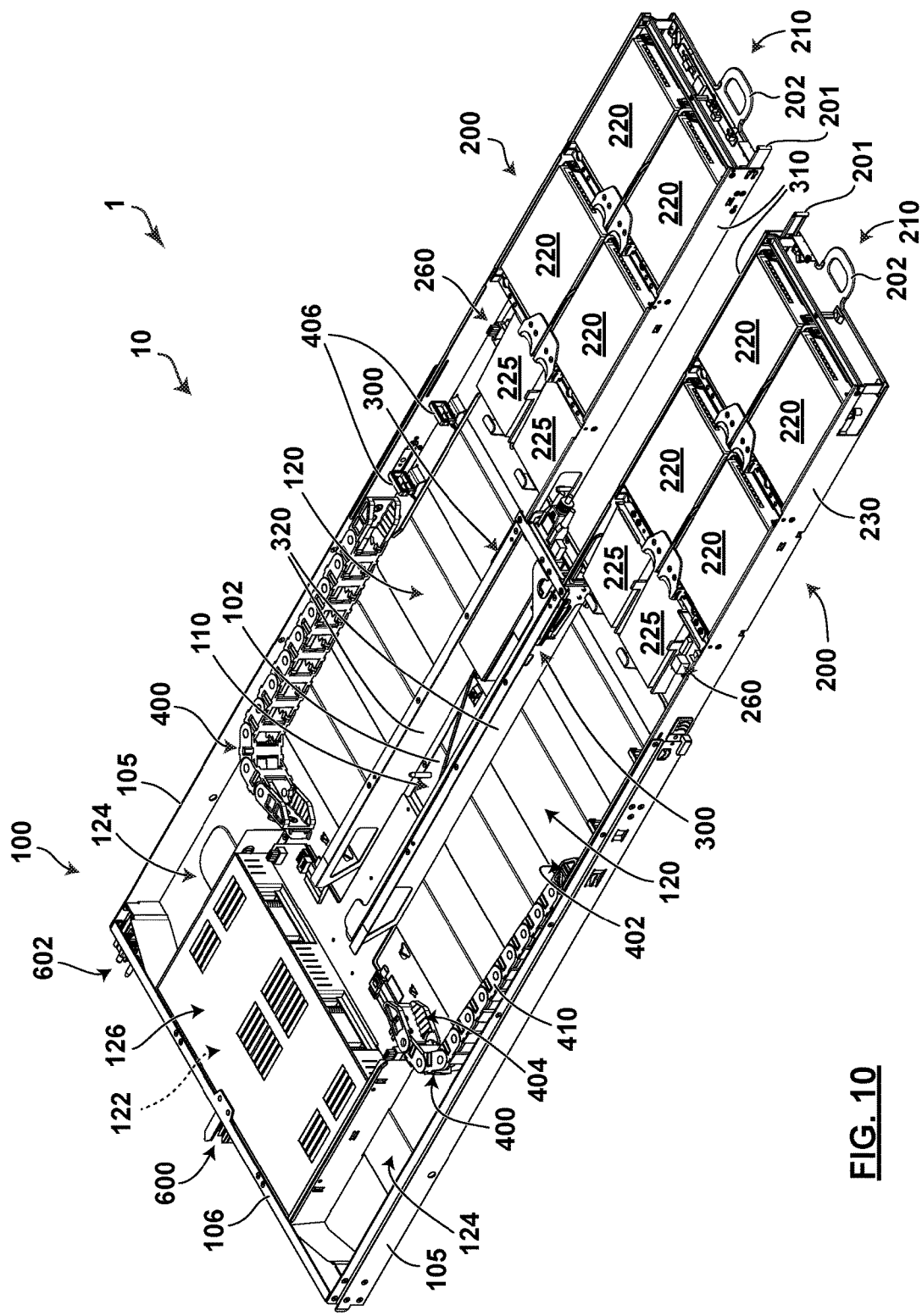
FIG. 10 is a front right perspective view of the dual-action storage media chassis structure of FIG. 3 with the left and right storage media modules being in the second withdrawn position.

With reference to FIG. 10, there is depicted a dual-action storage media chassis system 1 that comprises a dual-action storage media chassis structure 10. The dual-action storage media chassis structure 10 comprises a chassis 100, two storage media modules 200 and two dual-action slide assemblies 300.

The chassis 100 is formed by a bottom surface 102, two outer walls 105 attached to the bottom surface 102 on each lateral side thereof and a back wall 106 attached to the bottom surface 102 at a back side thereof. The two outer walls 105 extend longitudinally from a front side of the bottom surface 102 to the back side thereof (where the back wall 106 is). The back wall 106 extends laterally between the two outer walls 105 and is attached at each end to a back end of the respective outer wall 105.

The chassis 100 includes a partition corridor 110 defined by the bottom surface 102 and by two inner slide walls 320 on the left and the right (all direction are defined as viewed the back wall of the chassis 100). The two inner slide walls 320 extend longitudinally in the chassis 100, extend parallel to the outer walls 105 and are attached to the bottom surface 102 of the chassis 100.

The chassis 100 also includes two storage spaces 120 which are at least partially formed by the partition corridor 110. The left storage space 120 is defined by the bottom surface 102, by the left outer wall 105 on the left and by the left inner slide wall 320 on the right. Similarly, the right storage space 120 is defined by the bottom surface 102, by the right outer wall 105 on the right and by the right inner slide wall 320 on the left. The two storage spaces 120 are symmetrically disposed on both sides of the partition corridor 110. In a specific non-limiting embodiment of the present technology, the two storage spaces 120 can be mirror images of each other along a longitudinal axis of the chassis 100.

Figure 6:
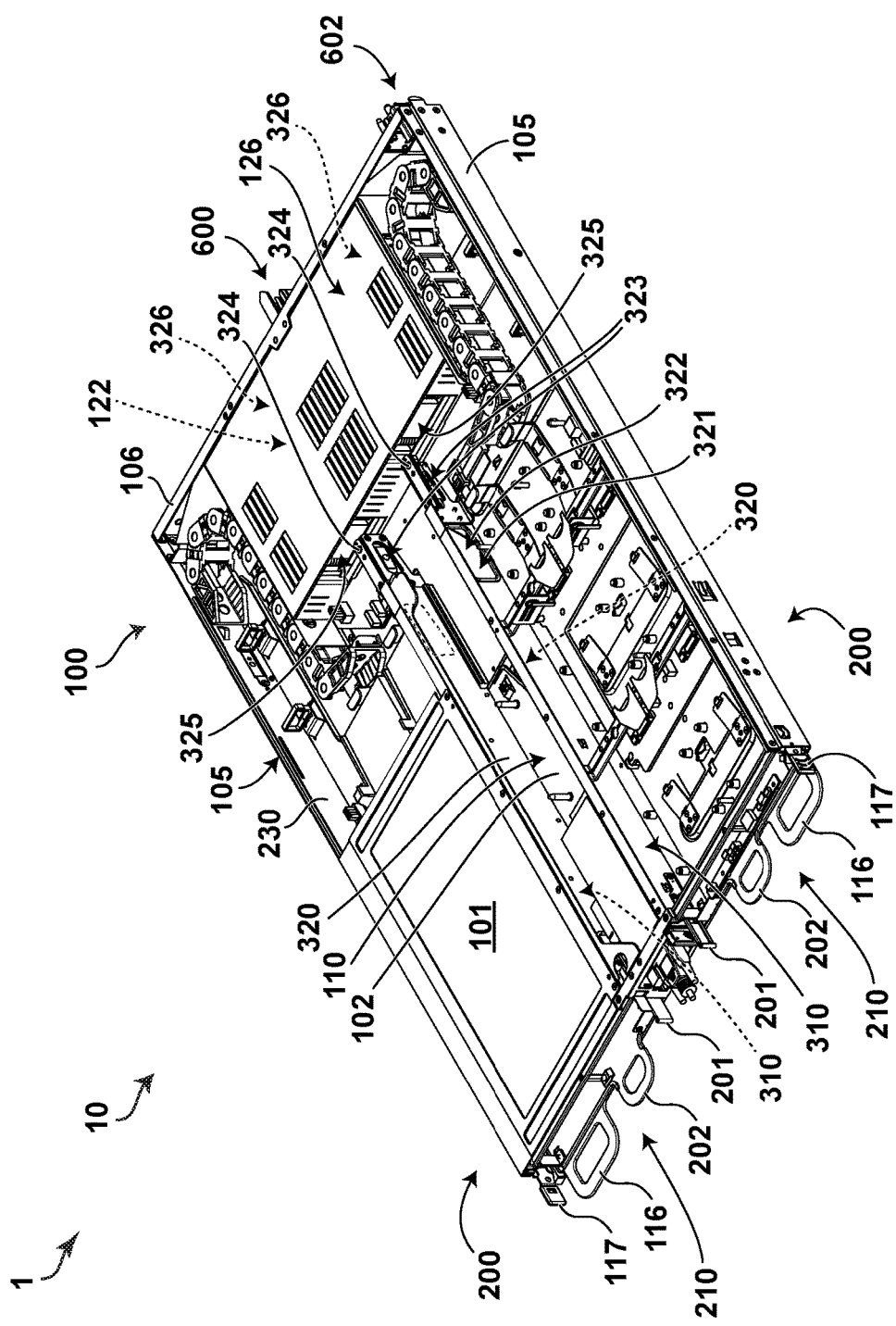
FIG. 6 is a front left perspective view of the dual-action storage media chassis structure of FIG. 5 with the first and second pluralities of storage media of the right storage media module and with the right top cover.
Figure 7:
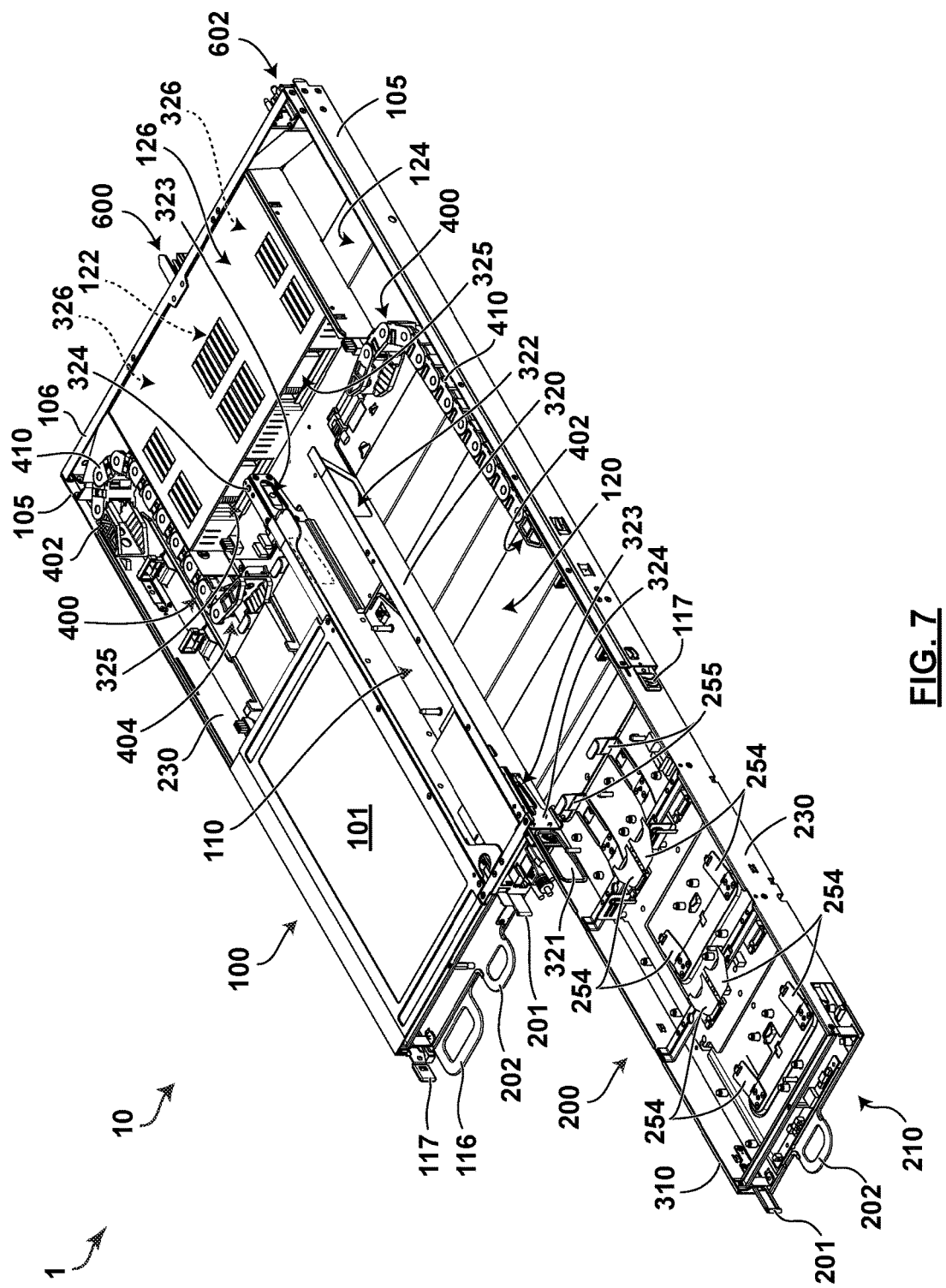
FIG. 7 is a front left perspective view of the dual-action storage media chassis structure of FIG. 4.
Figure 11:
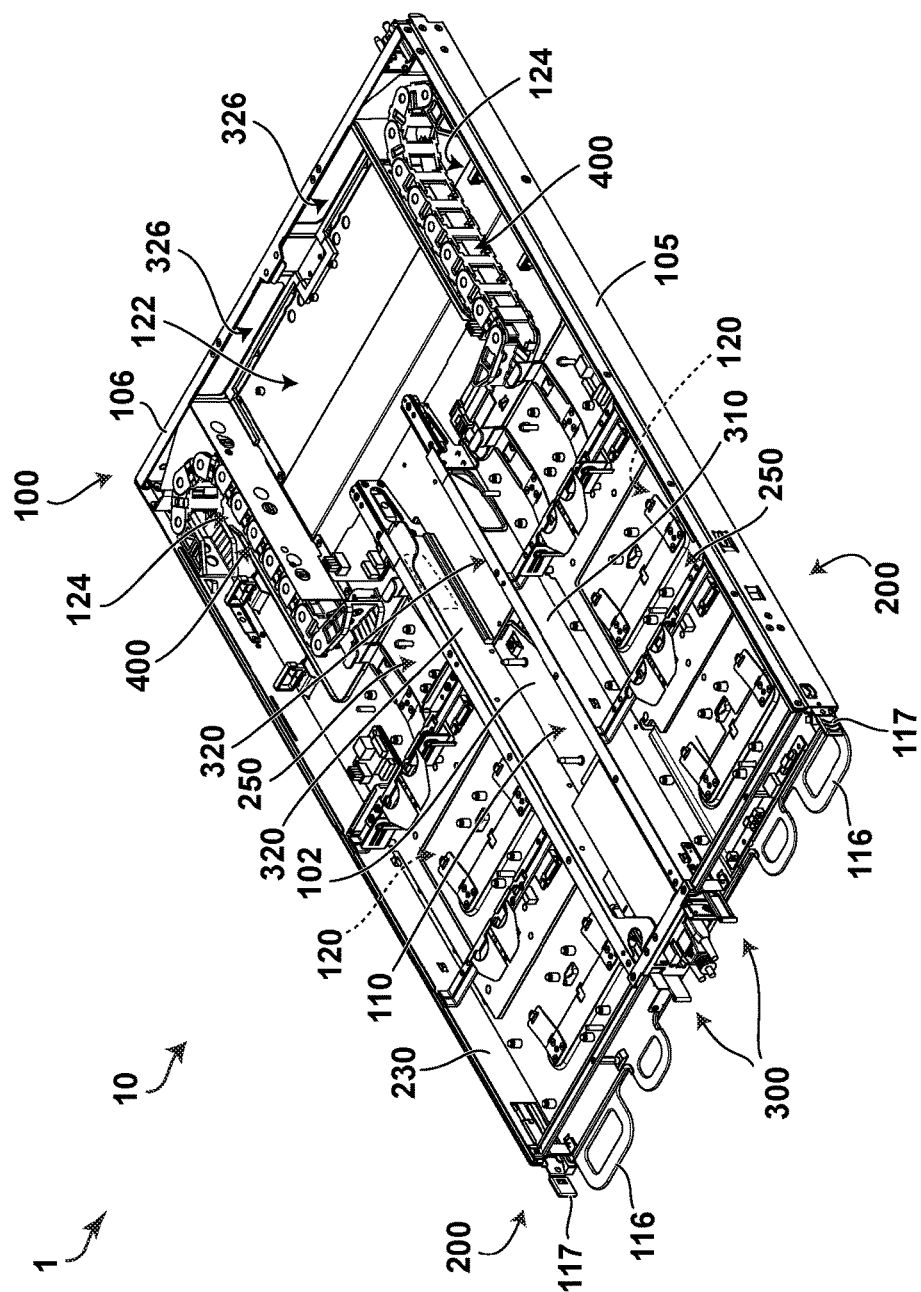
FIG. 11 is a front left perspective view of the dual-action storage media chassis structure of FIG. 5 without the CPU.

The chassis 100 also includes a central back storage space 122, as best seen in FIG. 11, for accommodating a third-type of an electronic component, such as a central processing unit (CPU) 126 depicted in FIGS. 6 and 7. The CPU 126 can have an operating temperature of 95 degrees Celsius (as an example). Alternatively, the CPU 126 may be operating at about 95 degrees Celsius and, as such, the operating temperature of the CPU 126 may be between 90 degrees Celsius and 100 degrees Celsius. The CPU 126 has internal conduits 325 for allowing air to enter and circulate around high temperature regions of the CPU 126 thus providing cooling to the CPU 126.

Figure 15:
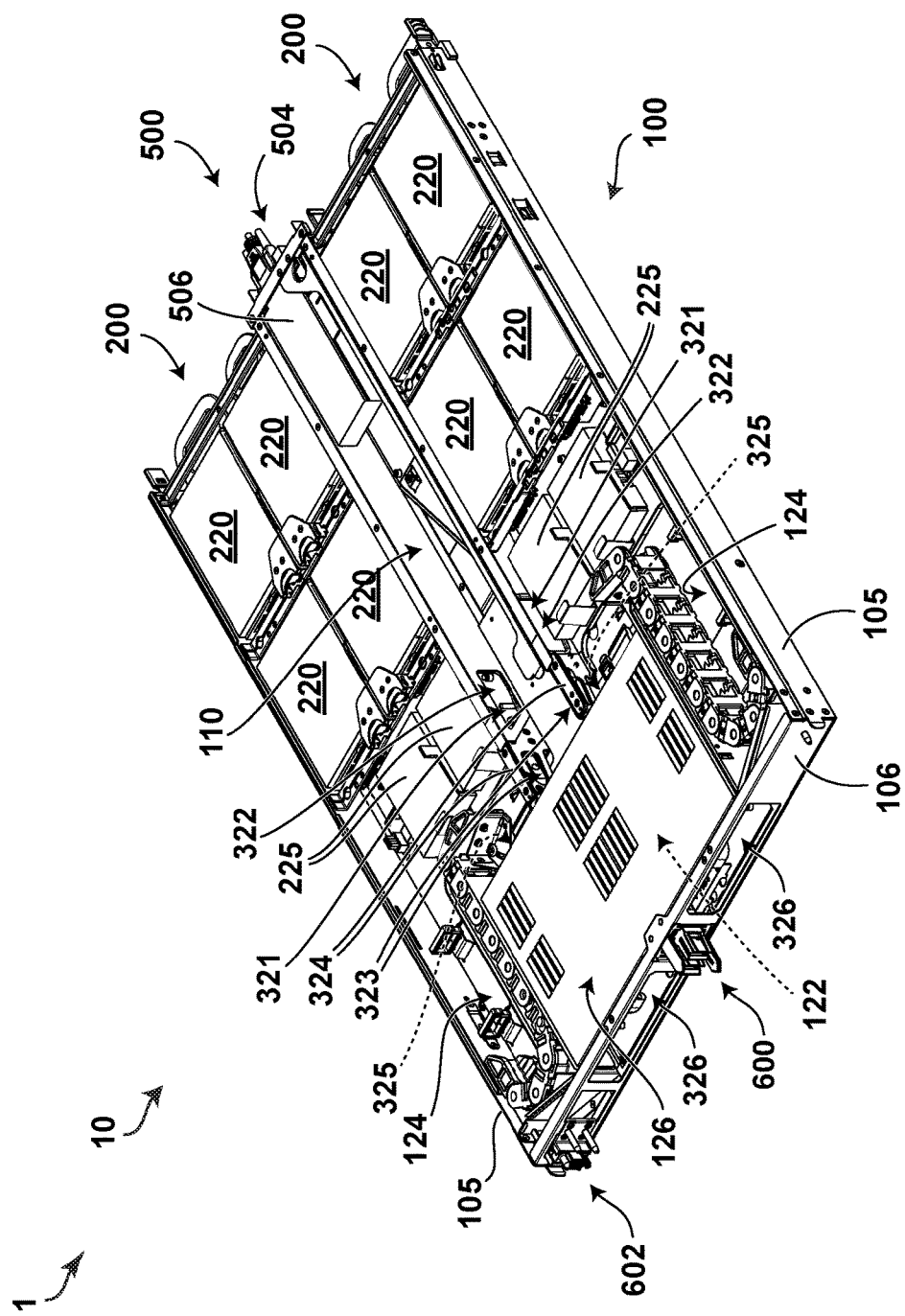
FIG. 15 is a back right perspective view of the dual-action storage media chassis structure of FIG. 3.

As best seen in FIG. 15, the CPU 126 has a power connector 600 that provides power to the CPU 126 and to other electrical components of the dual-action storage media chassis system 1. The back wall 106 is adapted for insertion of the power connector 600 through the back wall 106 when the CPU 126 is accommodated in the central back storage space 122. The back wall 106 also has two apertures 326 that are laterally aligned with the internal conduits 325 of the CPU 126 when the CPU 126 is accommodated in the central back storage space 122. As a result, air that entered, from the inside of the dual-action storage media chassis system 1, into the internal conduits 325 and circulated around high temperature regions of the CPU 126, exits from the dual-action storage media chassis system 1 at the back side thereof through the two apertures 326.

The back wall 106 also supports a management-port connector 602 of the dual-action storage media chassis system 1 on a left side of the back wall 106. The management-port connector 602 connects the dual-action storage media chassis system 1 to main management busses of a server rack (not depicted) in which the dual-action storage media chassis system 1 can be installed.

Returning to FIG. 10, the chassis 100 also includes two chain storage spaces 124 for accommodating a respective chain structure 400 during movement of the respective storage media module 200 as it will be further described herein below.

Figure 4:
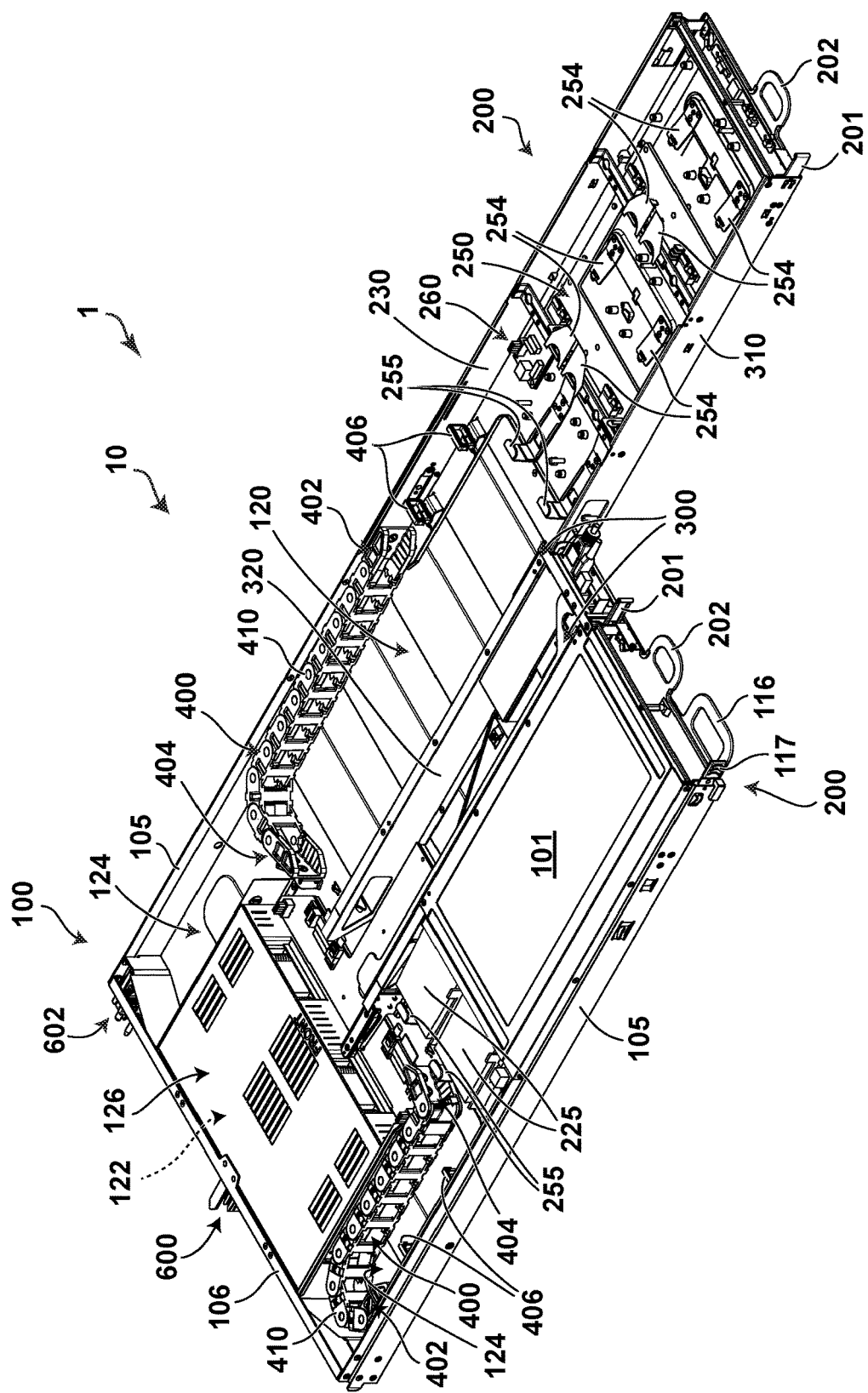
FIG. 4 is a front right perspective view of the dual-action storage media chassis structure of FIG. 2 with the right top cover.

With reference to FIG. 4, the chassis 100 also includes a top right cover 101 attached to the right outer wall 105 at the top thereof and to the right inner slide wall 320 at the top thereof. The top cover 101 provides additional structural integrity to the chassis 100. Additionally, the chassis 100 may include a top left cover attached to the left outer wall 105 at the top thereof and to the left inner slide wall 320 at the top thereof. Therefore, it is contemplated that the chassis 100 may include two top covers 101.

Figure 3:
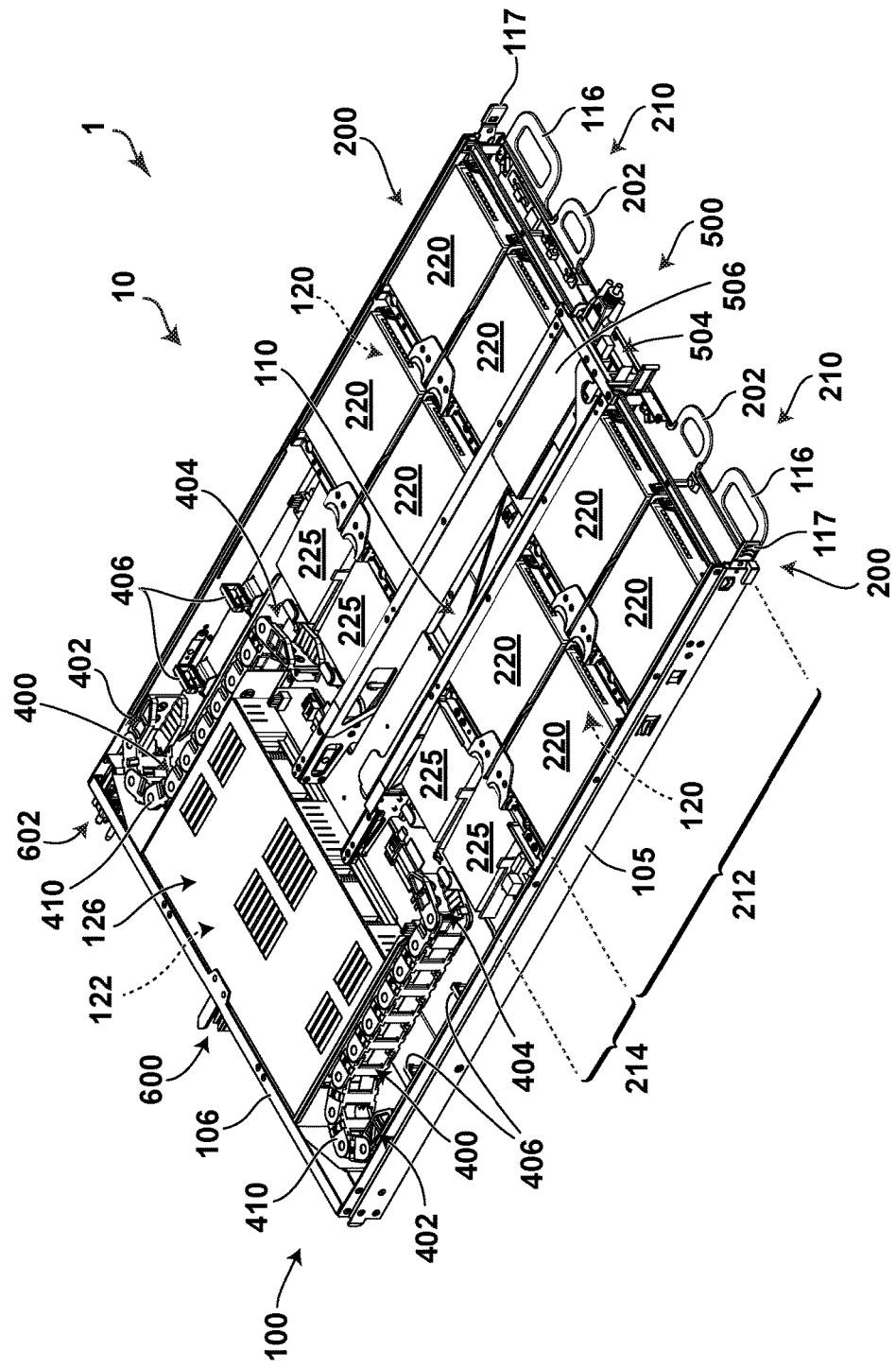
FIG. 3 is a front right perspective view of the dual-action storage media chassis structure of FIG. 1 with the first and second pluralities of storage media.
Figure 13:
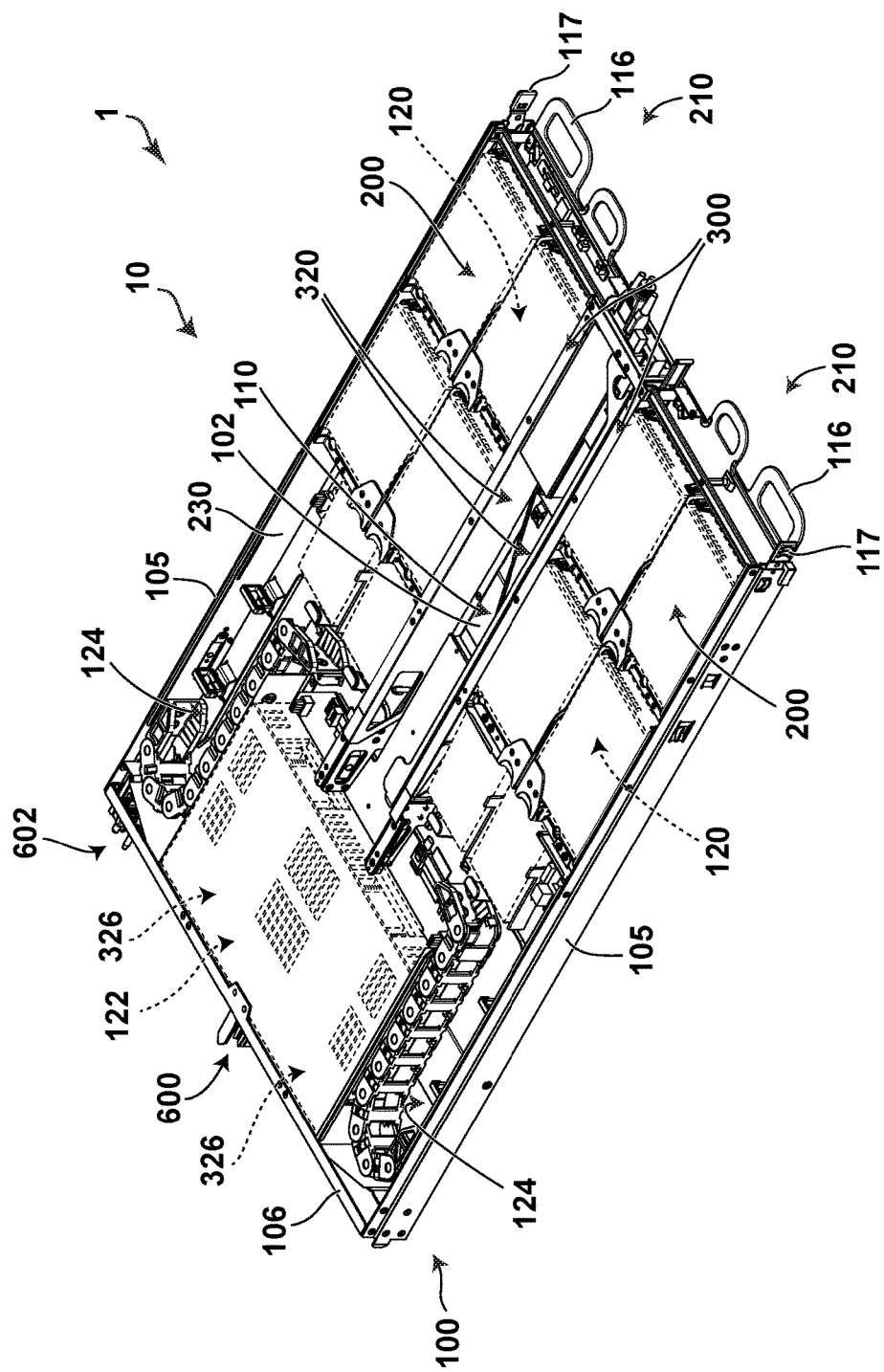
FIG. 13 is a front right perspective view of the dual-action storage media chassis structure of FIG. 3 with the CPU being dotted-out and the first and second pluralities of storage media of the left and right storage media modules being dotted-out.

Each storage media module 200 is accommodated in the respective storage space 120 when the respective storage media module 200 is in a received position, such as depicted in FIGS. 3 and 13. The left storage media module 200 is a mirror image of the right storage media module 200. Each storage media module 200 includes a respective tray frame 210, a respective first plurality of storage media 220 and a respective second plurality of storage media 225.

Figure 9:
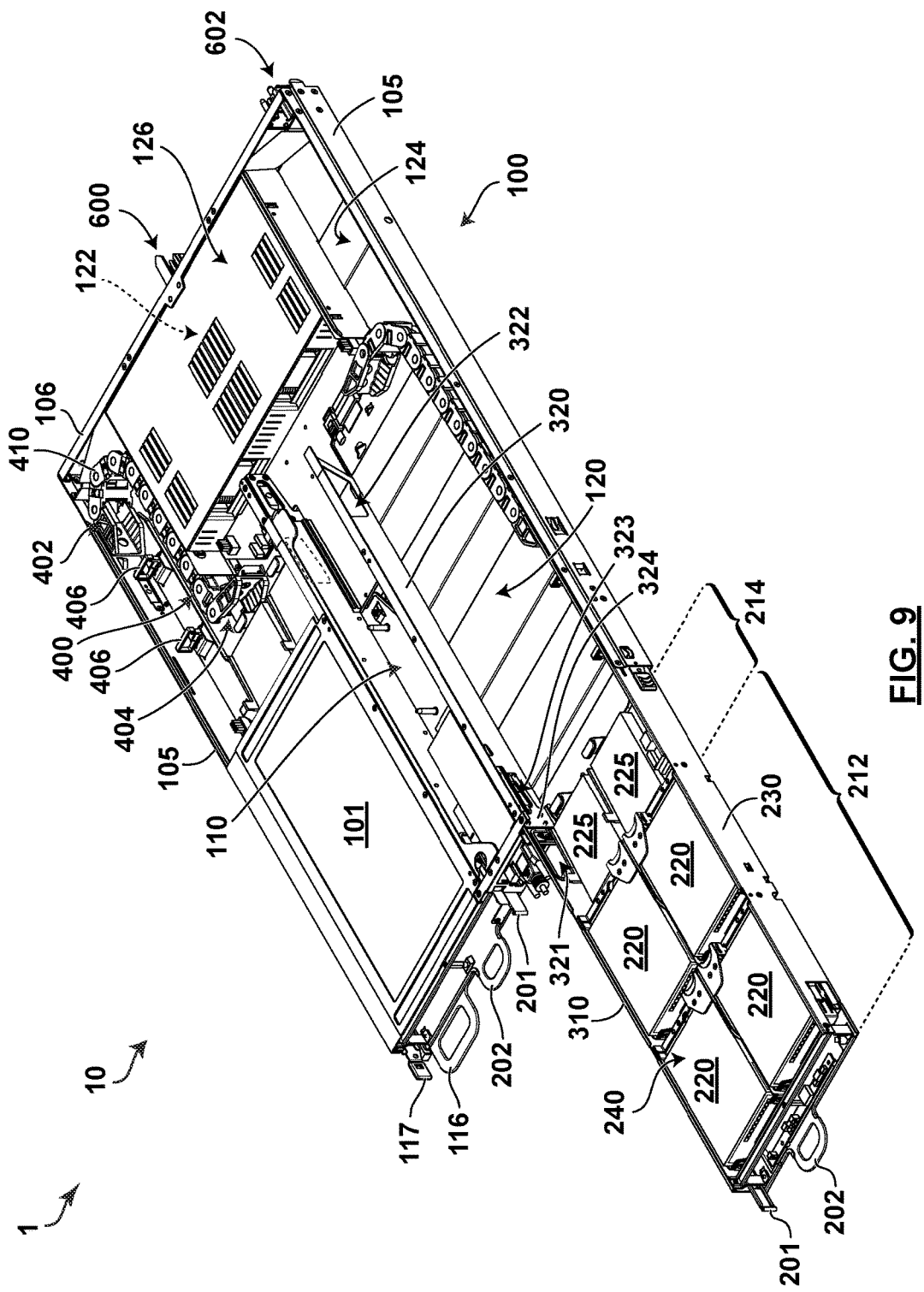
FIG. 9 is a front left perspective view of the dual-action storage media chassis structure of FIG. 7 with the first and second pluralities of storage media of the left storage media module.

Each tray frame 210 has a front portion 212 and a back portion 214 (see, for example, FIG. 9). The front portion 212 of a given tray frame 210 accommodates the first plurality of storage media 220 and the back portion 214 of the given tray frame 210 accommodates the second plurality of storage media 225. The first plurality of storage media 220 and the second plurality of storage media 225 are of distinct types of storage media. The first plurality of storage media 220 is a plurality of hard disk drives (HDDs). The second plurality of storage media 225 is a plurality of solid-state drives (SSDs). Alternatively, the second plurality of storage media 225 may be a plurality of non-volatile memory storage media (NVMEs).

The first plurality of storage media 220 has an operating temperature of 50 degrees Celsius (as an example). Alternatively, the first plurality of storage media 220 may be operating at about 50 degrees Celsius and, as such, the operating temperature of the first plurality of storage media 220 may be between 45 degrees Celsius and 55 degrees Celsius. The second plurality of storage media 225 has an operating temperature of 70 degrees Celsius (as an example). Alternatively, the second plurality of storage media 225 may be operating at about 70 degrees Celsius and, as such, the operating temperature of the second plurality of storage media 225 may be between 65 degrees Celsius and 75 degrees Celsius.

The first plurality of storage media 220 is disposed in each respective front portion 212 of the respective tray frame 210 in a two-by-two arrangement. The second plurality of storage media 225 is disposed in each respective back portion 214 of the respective tray frame 210 in a two-by-one arrangement.

Figure 14:
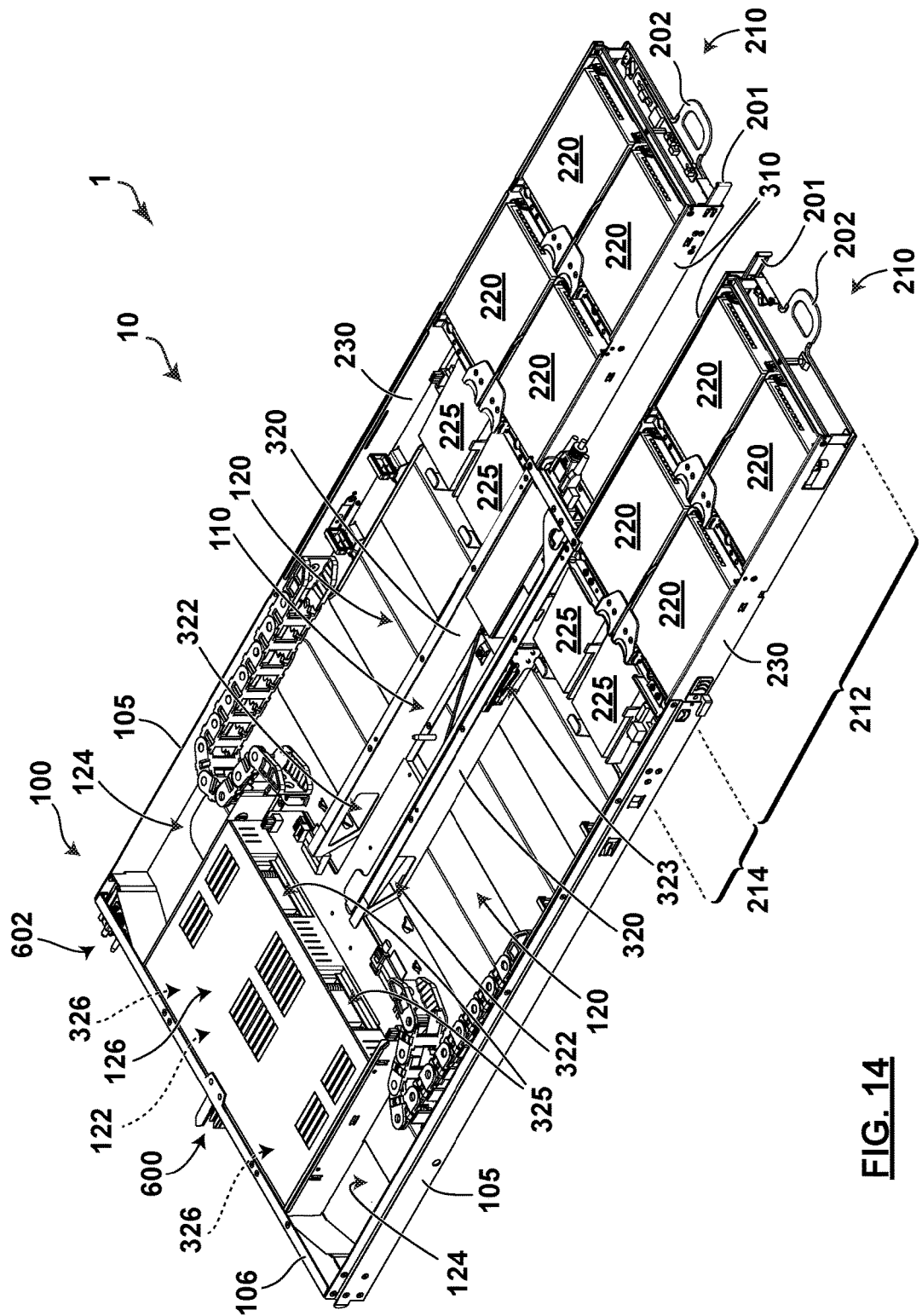
FIG. 14 is a front right perspective view of the dual-action storage media chassis structure of FIG. 10 with the left and right storage media modules being in the first withdrawn position.

Each tray frame 210 has a top access opening 240 (see FIG. 9) for providing access to the first plurality of storage media 220 when the tray frame 210 is in a first withdrawn position, such as depicted in FIG. 14. Indeed, although the top covers 101 are not depicted in FIG. 14 for ease of illustration, it is contemplated that in the first withdrawn position, the back portion 214 of a given tray frame 210 and the respective second plurality of storage media 225 are covered by the respective top cover 101, thus being inaccessible. When a given tray frame 210 is in the first withdrawn position, the respective first plurality of storage media 220 can be installed into or removed from the given tray frame 210 individually through the respective top access opening 240.

However, the top access opening 240 provides access to both the respective first and second pluralities of storage media 220 and 225 when the respective tray frame 210 is in a second withdrawn position, such as depicted in FIG. 9. When a given tray frame 210 is in the second withdrawn position, the respective first and second pluralities of storage media 220 and 225 can be arranged into or removed from the respective tray frame 210 individually through the respective top access opening 240.

With reference to FIG. 3, when the given tray frame 210 is in the received position, the front portion 212 of the given tray frame 210, the back portion 214 of the given tray frame 210 and the center back storage space 122 are disposed longitudinally sequentially in the chassis 100. Put another way, when the given tray frame 210 is in the received position, the first plurality of storage media 220, the second plurality of storage media 225 and the CPU 126 are disposed longitudinally sequentially in the chassis 100.

Figure 12:
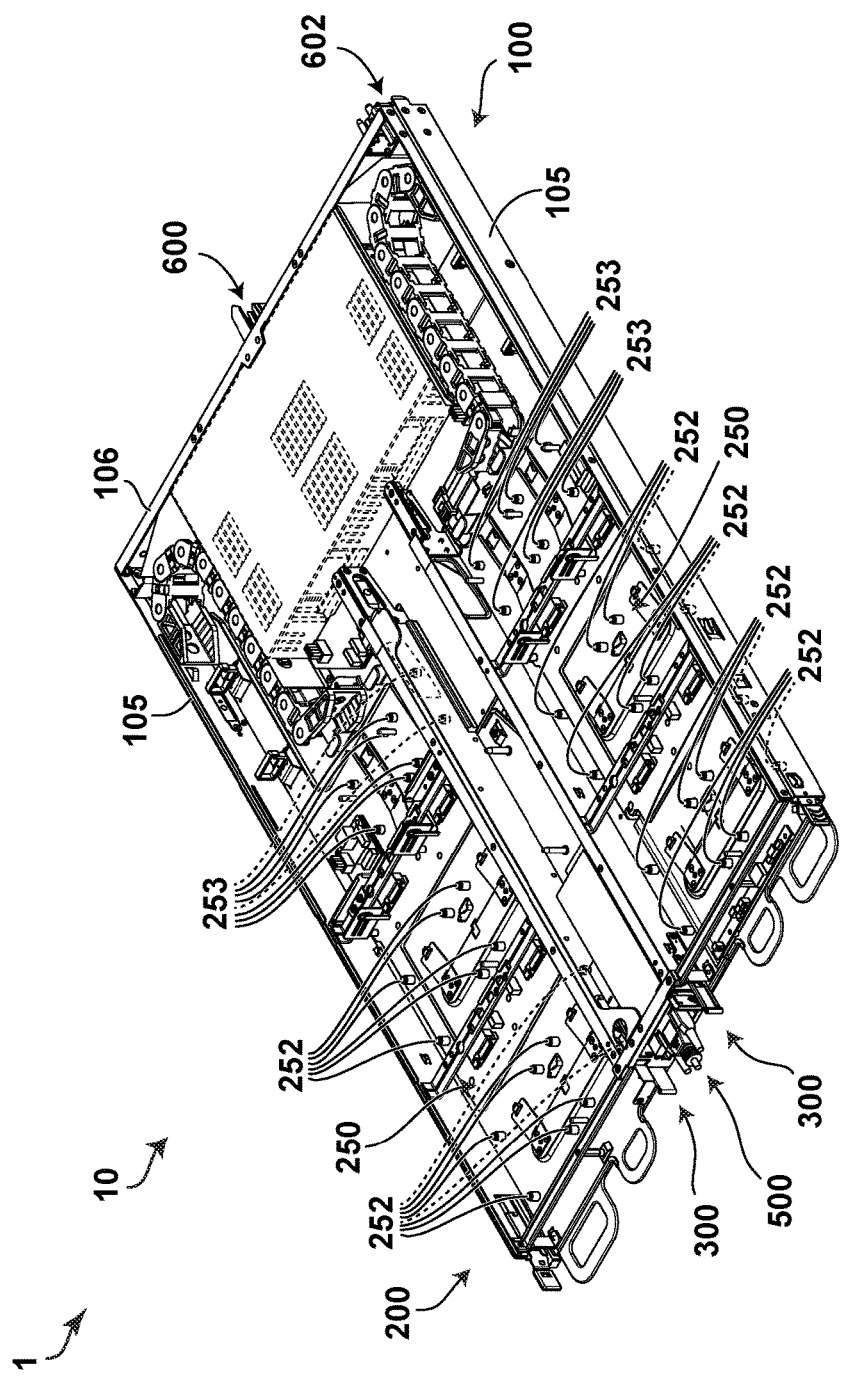
FIG. 12 is a front left perspective view of the dual-action storage media chassis structure of FIG. 5 with the CPU being dotted-out.

Each storage media module 200 further has a storage media combination frame 250, as best shown in FIG. 12, which is attached to the bottom of the respective tray frame 210 and is adapted for electrically coupling each one of the respective first plurality of storage media 220 and each one of the respective second plurality of storage media 225. Each storage media combination frame 250 has connectors 252 for electrically coupling each one of the respective first plurality of storage media 220 to the storage media combination frame 250. Each storage media combination frame 250 has connectors 253 for electrically coupling each one of the respective second plurality of storage media 225 to the storage media combination frame 250.

Figure 2:
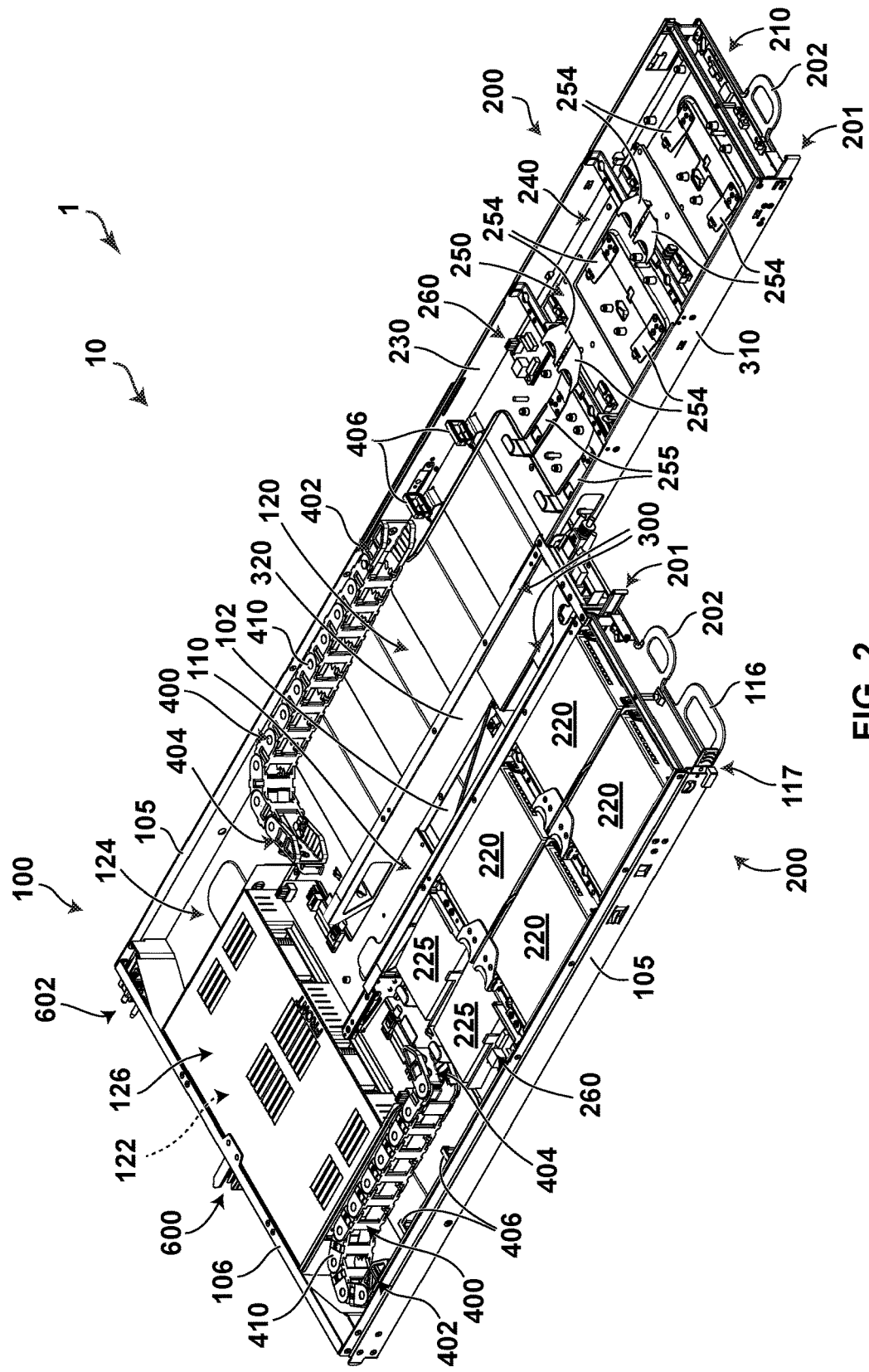
FIG. 2 is a front right perspective view of the dual-action storage media chassis structure with the right storage media module being in the received position, with the left storage media module being in a second withdrawn position, with a CPU, without the first and second pluralities of storage media of the left storage media module and without the left and right top covers.

Each storage media module 200 further has latching structures 254, as best shown in FIG. 2, that are operatively connected with the respective tray frame 210 for latching each one of the respective first plurality of storage media 220 to the storage media combination frame 250. Each storage media module 200 further has latching structures 255 that are operatively connected with the respective tray frame 210 for latching each one of the respective second plurality of storage media 225 to the storage media combination frame 250.

The latching structures 254 are of a first type of touch-latches and the latching structures 255 are of a second type of touch-latches. Therefore, the first plurality of storage media 220 and the second plurality of storage media 225 are latched differently to the respective storage media combination frame 250 and to the respective tray frame 210.

Alternatively, the latching structures 254 and 255 may be of any other type of latching structures that allow latching the first and the second pluralities of storage media 220 and 225, respectively to the storage media combination frame 250 so that they are electrically coupled to the storage media combination frame 250 by the connectors 252 and 253, respectively, when latched.

Each storage media module 200 further has a respective chain structure 400 that is attached to the respective tray frame 210 at one end by a respective chain attachment 402. Each chain structure 400 is pivotably attached to the bottom surface 102 of the chassis 100 at the other end by a respective pivotal chain attachment 404. Each chain structure 400 is pivotably attached to the bottom surface 102 of the chassis 100 in proximity to the central back storage space 122. Each chain structure 400 is formed by connecting a plurality of pivots 410 together. The chain structure 400 can limit the position of the respective tray frame 210 and cooperates with the respective dual-action slide assembly 300 to prevent the tray frame 210 from inadvertently falling out or disconnecting from the chassis 100.

Each chain structure 400 defines a hollow passage (not numbered) for accommodating cabling for electrically coupling the CPU 126 and the respective storage media combination frame 250. The respective cabling is connected to the CPU 126 in proximity to the respective pivotal chain attachment 404 and extends from the other end to the one end of the chain structure 400 through the hollow passage defined by each pivot 410 of the respective chain structure 400. At the one end of the respective chain structure 400, the cabling continues to extend through respective guiding structures 406, which are attached to the respective tray frame 210, and is then connected to a respective tray framework 260 of the respective storage media module 200.

Each tray framework 260 is electrically coupled to the respective storage media combination frame 250 and is attached to the respective tray frame 210. Each chain structures 400 and the respective guiding structures 406 protect and provide an organized arrangement of the respective cabling, which electrically couples the CPU 126 with the respective first and second pluralities of storage media 220 and 225, during movement of the respective storage media module 200. Hence, the CPU 126 that is accommodated in the central back storage space 122 can monitor and control each one of the first and second plurality of storage media 220 and 225. It is contemplated that the CPU 126 may also perform additional operations for enabling the functionalities of a dual-action storage media chassis system 1.

With reference to FIG. 10, each dual-action slide assembly 300 includes a respective inner slide panel 310 and the respective inner slide wall 320. Each respective inner slide panel 310 is attached to the respective tray frame 210. Each inner slide panel 310 extends longitudinally in the chassis 100. Alternatively, a given inner slide panel 310 and the respective tray frame 210 may be integrally formed. Each inner slide wall 320 is adapted to slideably receive the respective inner slide panel 310. Each dual-action slide assembly 300 allows moving the respective tray frame 210 between the second withdrawn position, the first withdrawn position and the received position.

It is contemplated that, in additional embodiments of the present technology, the dual-action storage media chassis structure 10 may further comprise a respective guiding assembly (not depicted) for each storage media module 200. Each guiding assembly may be located between a respective side panel 230 of the respective tray frame 210 and the respective outer wall 105. A given guiding assembly may aid in guiding the respective tray frame 210 as it moves and may cooperate with the respective dual-action slide assembly 300 for moving the respective tray frame 210 between the second withdrawn position, the first withdrawn position and the received position.

Each dual-action slide assembly 300 is adapted to latch the respective tray frame 210 in the second withdrawn position and the first withdrawn position. Each dual-action slide assembly 300 is adapted to lock the respective tray frame 210 in the received position. How each dual-action slide assembly 300 is adapted for latching the respective tray frame 210 in any one of the second withdrawn position and the first withdrawn position and for locking the respective tray frame 210 in the received position will be further described herein below.

Figure 5:
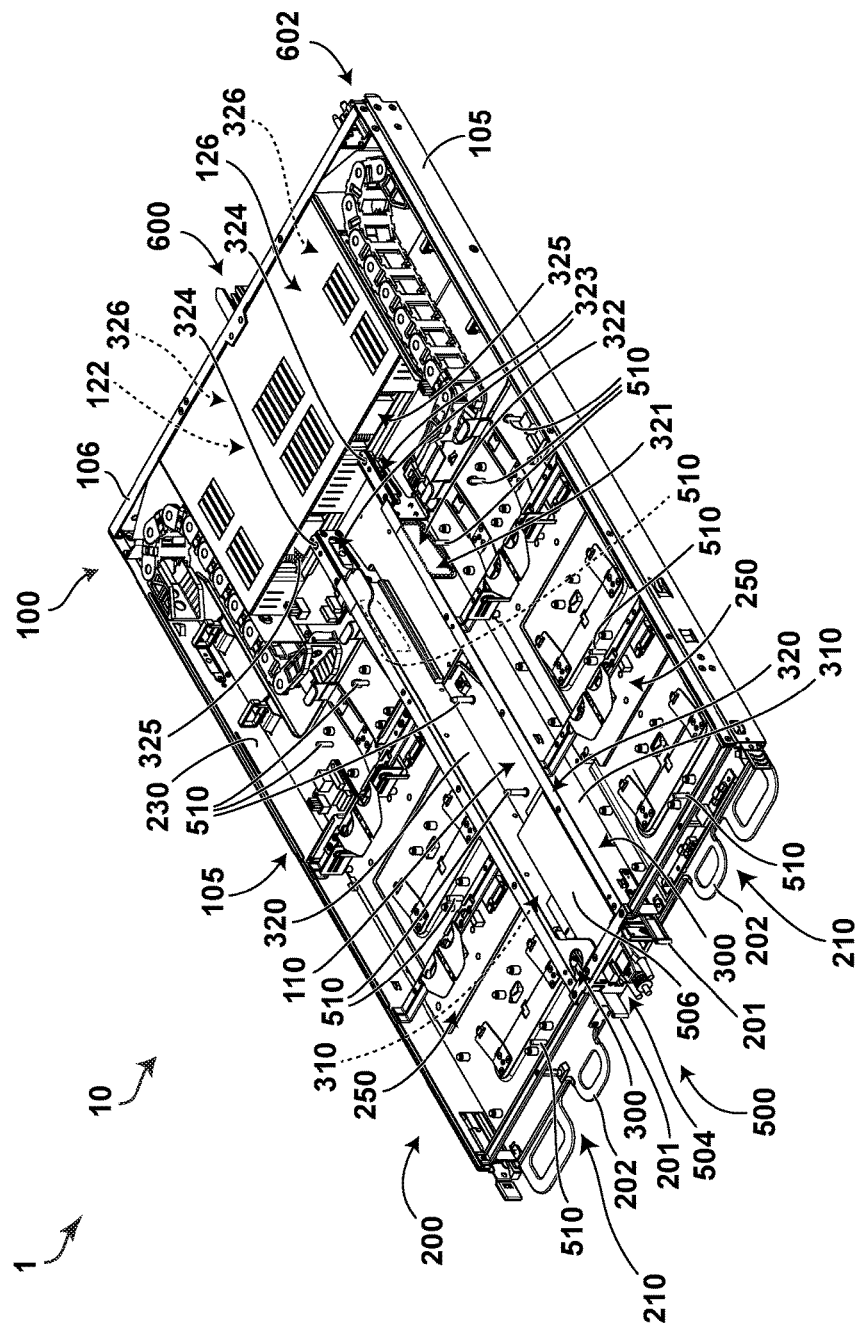
FIG. 5 is a front left perspective view of the dual-action storage media chassis structure of FIG. 1.

As best shown in FIG. 5, the dual-action storage media chassis system 1 is provided with a front operator panel 500. The front operator panel 500 is attached to the chassis 100 and to the inner slide walls 320 on the left and on the right thereof. The front operator panel 500 is disposed opposite to the back wall 106 of the chassis 100 and is laterally aligned with the partition corridor 110.

The front operator panel 500 supports a plurality of ports (not numbered) and a plurality of buttons (not numbered). The plurality of ports may comprise, but is not limited to: USB ports, video display ports, eSATA ports, serial ports, Ethernet port, debug port, and the like. The plurality of buttons may comprise, but is not limited to: power button, firmware reboot button, and the like.

The plurality of ports are electrically coupled to a front hardware unit 506 that is disposed in the partition corridor 110 such that an aperture 504 of the front operator panel 500 is unobstructed by the front hardware unit 506. The front hardware unit 506 enables an emergency reset mechanism or a reboot functionality of the dual-action storage media chassis system 1 and allows restoring damaged BIOS and BMC firmware, for example. An operator may perform the reboot by pressing the reboot button, for example. The front hardware unit 506 also enables at least some operational and at least some safety functionalities of the dual-action storage media chassis system 1. The front hardware unit 506 also enables an electrical coupling of the dual-action storage media chassis system 1 with external computer devices that are connected to any one of the plurality of ports.

Figure 1:
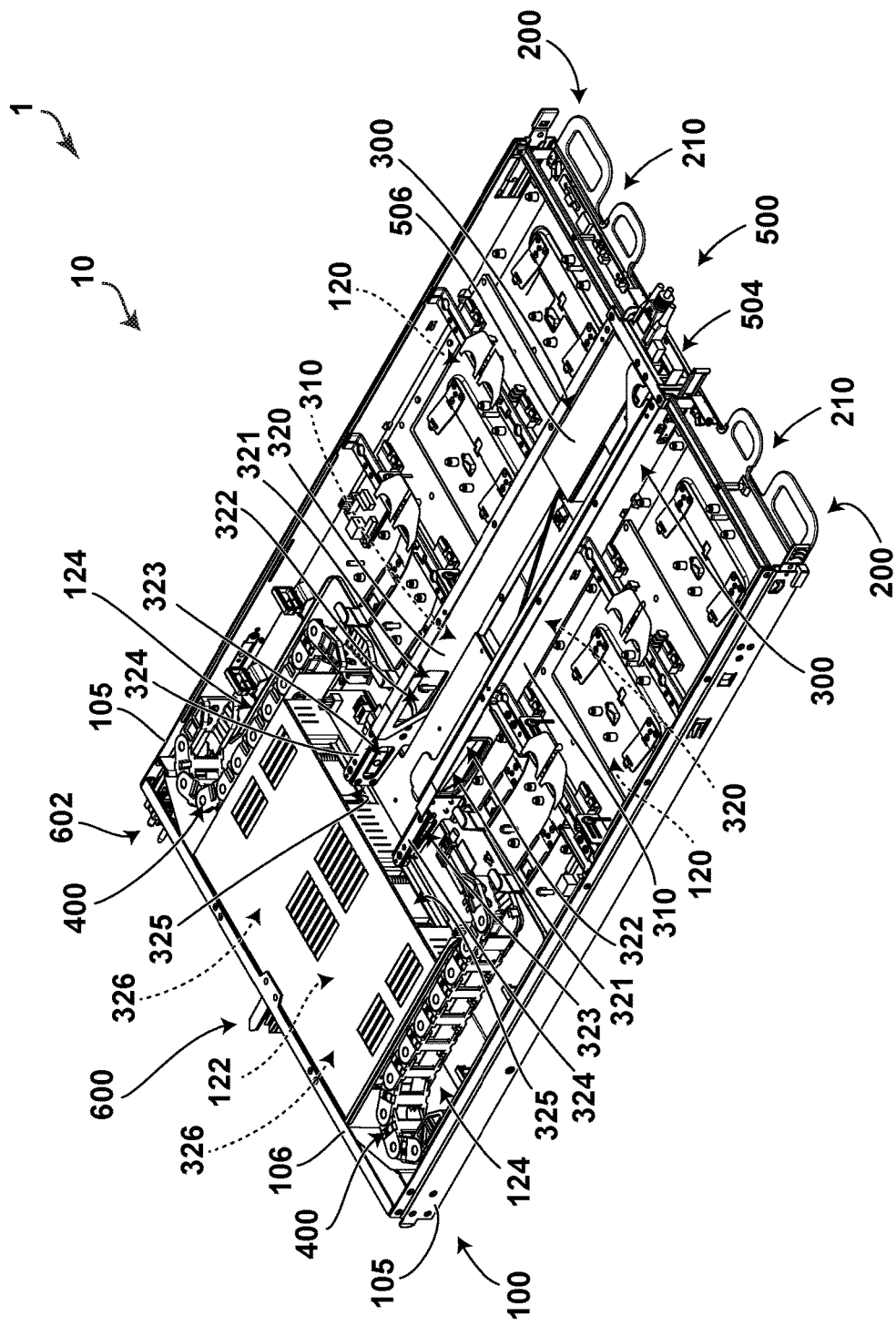
FIG. 1 is a front right perspective view of a dual-action storage media chassis structure with a left and right storage media modules being in a received position, with a CPU, without a first and second pluralities of storage media and without a left and right top covers.

With reference to FIGS. 1, 5 and 15, cooling of the dual-action storage media chassis system 1 will now be described.

The front operator panel 500 has the aperture 504 that allows a fluid communication between the outside of the dual-action storage media chassis system 1 and the inside of the partition corridor 110. The partition corridor 110 is also in fluid communication with the chain storage spaces 124, the central back storage space 122 and the storage spaces 120.

While air is circulating in the dual-action storage media chassis system 1, each of a plurality of thermocouples 510 is measuring a respective local air temperature in order to monitor whether various electrical components, such as the first plurality of storage media 220, the second plurality of storage media 225 and the CPU 126 are operating at temperatures corresponding to their respective operating temperatures.

Air may enter at the front of each storage media module 200 and travel along the first plurality of storage media 220 towards the second plurality of storage media 225. Air may enter through the aperture 504 into the partition corridor 110 and travel along the front hardware unit 506 towards the back. Having this additional airflow in the partition corridor 110 that is enabled by the aperture 504 increases cooling efficiency of the dual-action storage media chassis system 1. Additionally, due to the two-by-two arrangement of the first plurality of storage media 220 and due to the two-by-one arrangement of the second plurality of storage media 225 in each tray frame 210, the partition corridor 110 that extends longitudinally in the chassis 100 is in proximity with each and every storage media of both tray frames 210. This proximity between the partition corridor 110 and each and every storage media of both tray frames 210 may increase the cooling efficiency of the dual-action storage media chassis system 1.

Also, each inner slide wall 320 defines an airflow aperture 322 and each inner slide panel 310 defines an airflow aperture 321. The respective airflow apertures 321 and 322 are disposed such that, when the respective storage media module 200 is in the received position, the airflow apertures 321 and 322 are superposed and provide additional fluid communication between the partition corridor 110 and the respective storage spaces 120 through the respective superposed airflow apertures 321 and 322. Also, each inner slide panel 310 has an aperture structure 324 that is attached thereto at the back. Each aperture structure 324 is disposed such that it can be slideably received by the inner slide wall 320 during movement of the respective storage media module 200. Each aperture structure 324 has an aperture 323 defined therein for providing additional fluid communication between the partition corridor 110 and the respective storage spaces 120. This provision of additional fluid communication between the storage spaces 120 and the partition corridor 110 may increase the cooling efficiency of the dual-action storage media chassis system 1.

After entering at the front of each storage media module 200 and travelling along the first plurality of storage media 220 and along the second plurality of storage media 225, air travels towards the CPU 126 located rearwardly from the second plurality of storage media 225 in the chassis 100. Put another way, air that traveled longitudinally sequentially along the first plurality of storage media 220 and along the second plurality of storage media 225 travels towards the internal conduits 325 of the CPU 126 and enters the internal conduits 325 of the CPU 126. This air then circulates around high temperature regions of the CPU 126 and finally exits from the dual-action storage media chassis system 1 at a back side thereof through the two apertures 326.

It should be understood that while travelling longitudinally sequentially along the first plurality of storage media 220, the second plurality of storage media 225 and the CPU 126, air gradually heats up due to thermal energy dissipated by each one of the first plurality of storage media 220, the second plurality of storage media 225 and the CPU 126. As such, local air temperature in the dual-action storage media chassis system 1 generally increases with respect to its longitudinal axis away from the front end of the dual-action storage media chassis system 1. Therefore, positioning the first plurality of storage media 220, the second plurality of storage media 225 and the CPU 126 in the dual-action storage media chassis system 1 in a longitudinal sequence according to an increasing order of their respective operating temperatures may increase the cooling efficiency of the dual-action storage media chassis system 1.

With reference to FIGS. 3, 9 and 14, it will now be described how the operator can operate the given storage media module 200 of the dual-action storage media chassis structure 10. This operation of the given storage media module 200 by the operator will be described with reference to the left storage media module 200 only. It should be understood however that the operator can operate the right storage media module 200 of the dual-action storage media chassis structure 10 in a similar manner since, as previously mentioned, the right storage media module 200 is a mirror image of the left storage media module 200 and, therefore, for the sake of simplicity, the operation of the right storage media module 200 by the operator will not be described in greater detail herein below. It should be understood however that the operator may operate any one of the left and right storage media module 200 independently and/or simultaneously.

Figure 8:
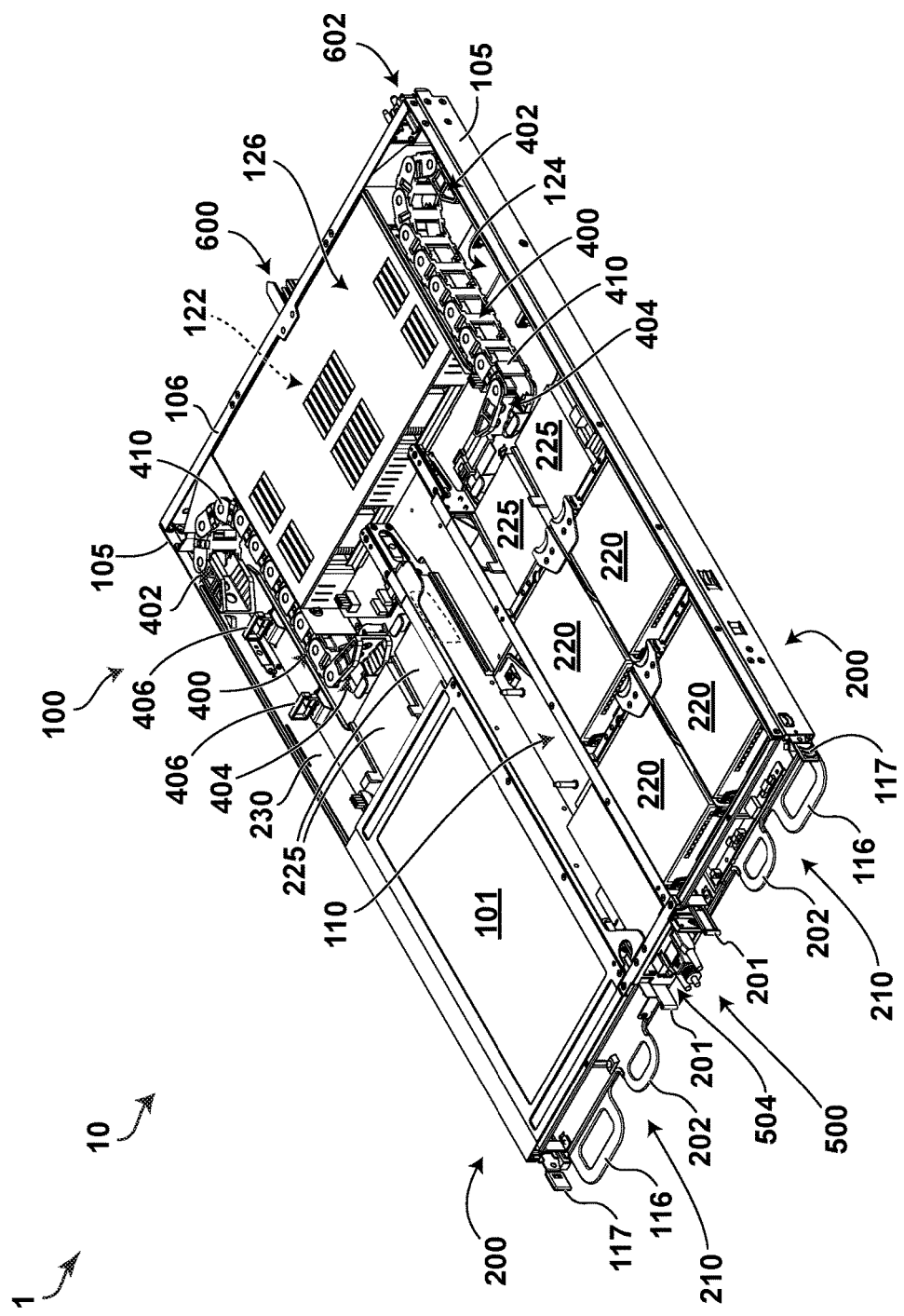
FIG. 8 is a front left perspective view of the dual-action storage media chassis structure of FIG. 3 with the right top cover.

The left tray frame 210 is depicted in FIGS. 3 and 8 in the received position. When the left tray frame 210 is in the received position, the respective first plurality of storage media 220 is covered by the left top cover (not depicted), which is affixed to the corresponding inner slide wall 320 and to the corresponding outer chassis wall 105, while the respective second plurality of storage media 225 of the left tray frame 210 is uncovered.

A left locking mechanism 201 is depicted in FIG. 4 in a released position and is located on the inner slide panel 310 of the left tray frame 210. When the left tray frame 210 is in the received position and the left locking mechanism 201 is in the released position, the left locking mechanism 201 cooperates with the corresponding inner slide wall 320 to lock the left tray frame 210. When the left tray frame 210 is in the received position and the left locking mechanism 201 is in the released position, the left locking mechanism 201 abuts against the corresponding inner slide wall 320. When the operator presses outwardly on the left locking mechanism 201, the left locking mechanism 201 is moved from the released position to an actuated position and the left locking mechanism 201 no longer abuts against the corresponding inner slide wall 320 and the left tray frame 210 becomes unlocked in the received position.

The left tray frame 210 comprises a left tray handle 202, which protrudes forwardly of the chassis 100. While pressing outwardly on the left locking mechanism 201, the operator pulls on the left tray handle 202 so as to slideably move the left tray frame 210 away from the chassis 100. The corresponding inner slide wall 320 cooperates with the inner slide panel 310 of the left tray frame 210 so as to allow a longitudinal and slideable movement of the left tray frame 210 away from the chassis 100 when the operator pulls on the left tray handle 202.

The left tray handle 202 is disposed in proximity of the left locking mechanism 201 so that the operator can single-handedly and simultaneously pull the left tray handle 202 and press on the left locking mechanism 201. When the left tray frame 210 is sufficiently longitudinally and slideably moved away from the chassis 100, the left locking mechanism 201 is positioned completely forward of the corresponding inner slide wall 320 and the operator can release the left locking mechanism 201 without locking the left tray frame 210 since the left locking mechanism 201 can no longer abut against the corresponding inner slide wall 320. The operator continues to pull on the left tray handle 202 until the left tray frame 210 reaches the first withdrawn position such as depicted in FIG. 14.

When the left tray frame 210 reaches the first withdrawn position, the left dual-action slide assembly 300 latches the left frame 210 in the first withdrawn position. When the left tray frame 210 is latched in the first withdrawn position, the operator has access to the first plurality of storage media 220 in the left tray frame 210 through the top access opening 240 of the left tray frame 210. When the left tray frame 210 is latched in the first withdrawn position, the operator does not have access to the second plurality of storage media 225 in the left tray frame 210 since in the first withdrawn position of the left tray frame 210 the second plurality of storage media 225 is covered by the left top cover (not depicted). This limited access to the first plurality of storage media 220 in the first withdrawn position allows repair and maintenance of any one of first plurality of storage media 220 without inadvertently unlatching or disconnecting any one of the second plurality of storage media 225.

The operator can release the left tray handle 202 and can remove from the left tray frame 210 any one of the corresponding first plurality of storage media 220 using both hands while avoiding an inadvertent movement of the left tray frame 210, since the left tray frame 210 is latched in the first withdrawn position. The operator can actuate the respective latching structure 254 in order to unlatch any one of the first storage media 220 while the left tray frame 210 is in the first withdrawn position. Once a given first storage media 220 is unlatched, the operator can remove the given first storage media 220 from the left tray frame 210 through the top access opening 240 of the left tray frame 210 and, therefore, disconnect the given first storage media 220 from the respective connectors 252. The operator can install into the left tray frame 210 a replacement first storage media 220 in lieu of the given first storage media 220 that was removed. To that end, the operator can position the replacement first storage media 220 over the respective connectors 252 and can press on the replacement first storage media 220 which actuates the respective latching structure 254 thereby latching the replacement first storage media 220 to the left tray frame 210.

The operator can pull again on the left tray handle 202 forwardly away from the chassis 100 while the left tray frame 210 is in the first withdrawn position. By pulling according to a threshold force on the left tray handle 202 forwardly away from the chassis 100 while the left tray frame 210 is in the first withdrawn position, the operator applies sufficient force on the left dual-action slide assembly 300 which unlatches the left frame 210 in the first withdrawn position and longitudinally and slideably moves the left tray frame 210 from the first withdrawn position towards the second withdrawn position. The left tray frame 210 is depicted in the second withdrawn position in FIG. 9.

When the left tray frame 210 reaches the second withdrawn position, the left dual-action slide assembly 300 latches the left frame 210 in the second withdrawn position. When the left tray frame 210 is latched in the second withdrawn position, the operator has access to the first and the second plurality of storage media 220 and 225 in the left tray frame 210 through the top access opening 240 of the left tray frame 210.

The operator can release the left tray handle 202 and can remove from the left tray frame 210 any one of the respective first plurality of storage media 220 and/or any one of the respective second plurality of storage media 225 using both hands while avoiding an inadvertent movement of the left tray frame 210, since the left tray frame 210 is latched in the second withdrawn position.

The operator can remove any one of the first storage media 220 while the left tray frame 210 is in the second withdrawn position similarly to how the operator can remove any one of the first storage media 220 while the left tray frame 210 is in the first withdrawn position. In order to remove any one of the second plurality of storage media 225 while the left tray is in the second withdrawn position, the operator can actuate the respective latching structure 255 in order to unlatch any one of the second storage media 225. Once a given second storage media 225 is unlatched, the operator can remove the given second storage media 225 from the left tray frame 210 through the top access opening 240 of the left tray frame 210 and, therefore, disconnect the given second storage media 225 from the respective connectors 253.

The operator can install into the left tray frame 210 a replacement second storage media 225 in lieu of the given second storage media 225 that was removed. To that end, the operator can position the replacement second storage media 225 over the respective connectors 253 so that the replacement second storage media 225 abuts against the respective latching structure 255 and can press on the replacement second storage media 225 which actuates the respective latching structure 255 thereby latching the replacement second storage media 225 to the left tray frame 210.

The operator can push on the left tray handle 202 towards the chassis 100 while the left tray frame 210 is in the second withdrawn position. By pushing according to the threshold force on the left tray handle 202 towards the chassis 100 while the left tray frame 210 is in the second withdrawn position, the operator applies sufficient force on the left dual-action slide assembly 300 which unlatches the left frame 210 in the second withdrawn position and longitudinally and slideably moves the left tray frame 210 from the second withdrawn position towards the first withdrawn position. The operator can push on the left tray handle 202 until the left tray frame 210 reaches the first withdrawn position such as depicted in FIG. 14.

When the left tray frame 210 reaches the first withdrawn position, the left dual-action slide assembly 300 latches the left frame 210 in the first withdrawn position. The operator can push again on the left tray handle 202 towards the chassis 100 while the left tray frame 210 is in the first withdrawn position. By pushing according to the threshold force on the left tray handle 202 towards the chassis 100 while the left tray frame 210 is in the first withdrawn position, the operator applies sufficient force on the left dual-action slide assembly 300 which unlatches the left frame 210 in the first withdrawn position and longitudinally and slideably moves the left tray frame 210 from the first withdrawn position towards the received position. Once the left tray frame 210 reaches the received position, the left locking mechanism 201 locks the left tray frame 210 in the received position.

The dual-action storage media chassis structure 10 is adapted for installment in a server rack (not depicted). In order be inserted and installed in the server rack, the outer walls 105 of the chassis 100 can cooperate with inner walls of the server rack for snuggly inserting the dual-action storage media chassis structure 10 into the server rack. The operator can snuggly insert the dual-action storage media chassis structure 10 into the server rack and can install it by pushing on chassis handles 116. By pushing on the chassis handles 116, the operator connects the power connector 600 to a power bus of the server rack and the management-port connector 602 to the main management busses of the server rack. Once the dual-action storage media chassis structure 10 is snuggly inserted into the server rack and is so-installed, chassis locks 117 of the chassis 100 cooperate with the inner walls of the server rack for locking the dual-action storage media chassis structure 10 in place.

The operator can remove the dual-action storage media chassis structure 10 from the server rack by actuating the chassis locks 117 thereby stopping the cooperation between the chassis locks 117 and the inner walls of the server rack. While actuating the chassis locks 117 (see for example, FIG. 2), the operator can pull (under-hand pull) on the chassis handles 116 for removing the dual-action storage media chassis structure 10 from the server rack.

In an alternative embodiment of the present technology, instead of the tray frame 210 having the front portion 212 and the back portion 214, the respective storage media module 200 may have first and second cooperating tray frames (not depicted) where the first cooperating tray frame may accommodate the first plurality of storage media 220 similarly to how the front portion 212 accommodates the first plurality of storage media 220 and the second cooperating tray frame may accommodate the second plurality of storage media 225 similarly to how the back portion 214 accommodates the second plurality of storage media 225. However, unlike the first portion 212 and the second portion 214, which integrally form the tray frame 210, the first cooperating tray frame and the second cooperating tray frame are distinct tray frames. The first cooperating tray frame at least partially overlaps the second cooperating tray frame when they are in the received position.

Both the first and the second cooperating tray frames are adapted for slideably moving longitudinally from the received position to a fully withdrawn position. The first cooperating tray frame slideably moves longitudinally at a first vertical height in the chassis 100 while the second cooperating tray frame slideably moves longitudinally at a second vertical height in the chassis. The first vertical height is superior to the second vertical height.

The operator can pull on the first cooperating tray frame until the first cooperating tray frame is withdrawn from the chassis 100. In this position, the first plurality of storage media 220 accommodated by the first cooperating tray frame is accessible through a top opening (not depicted) of the first cooperating tray frame. The operator can pull again on the first cooperating tray frame. When the operator pulls again on the first cooperating tray frame, a first cooperation structure (not depicted) of the first cooperating tray frame engages with a second cooperation structure of the second cooperating tray frame and, as a result, the pulling force exerted on the first cooperating tray frame is transferred to the second cooperating tray frame by the engaged first and second cooperation structures thereby resulting in a slideable longitudinal movement of both the first cooperating tray frame and the second cooperating tray frame. When the second cooperating tray frame is withdrawn from the chassis 100, in addition to the first plurality of storage media being accessible, the second plurality of storage media 225 accommodated by the second cooperating tray frame is also accessible through a top opening (not depicted) of the second cooperating tray frame. Thus, it can be said that the first cooperating tray frame and the second cooperating tray frame may be adapted for a sequential and telescopic withdrawal from the chassis 100.

In some embodiments of the present technology, the implementation of the chassis 100 that includes two storage spaces 120 that are separately actuatable (i.e. that can be opened and retracted separately) can be a technical effect where one can open a given one of the two storage spaces 120 without needing to open/close the other one. This, in turn, can have a technical effect whereby undesirable vibration of the components stored in the other one of the two storage spaces 120 that is not opened/closed is avoided. In those embodiments of the present technology where the first cooperating tray frame slideably moves longitudinally at a first vertical height in the chassis 100 while the second cooperating tray frame slideably moves longitudinally at a second vertical height in the chassis, the undesirable vibration can further be reduced for one of the first cooperating tray frame and the second cooperating tray frame.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A dual-action storage media chassis structure, comprising: a chassis including: a partition corridor defined by two inner slide walls longitudinally extending in the chassis; two storage spaces and two chain storage spaces symmetrically disposed on both sides of the partition corridor, respectively; and a central back storage space located between the chain storage spaces for accommodating a third-type of electronic component having a third operating temperature; two storage media modules accommodated respectively in the two storage spaces, each storage media module including: a tray frame, each tray frame including a top access opening, each tray frame for accommodating a second-type of electronic component having a second operating temperature in a back portion of the tray frame and for accommodating a first-type of electronic component having a first operating temperature in a front portion of the tray frame; and an extension having guiding structures extended along a side opposite to the corresponding inner side wall and connected to a chain structure formed by hollow passages; a cable is connected to the third type of electronic component through the guiding structures and the hollow passages and received in the chain storage space; two dual-action slide assemblies, each dual-action slide assembly including: o a corresponding one of the two inner slide walls and a respective inner slide panel longitudinally extending in the chassis and attached to the respective tray frame, the corresponding one of the two inner slide walls adapted for slideably receiving the respective inner slide panel; each dual-action slide assembly for longitudinally and slideably moving the respective tray frame between a received position, a first withdrawn position and a second withdrawn position; the front portion of a given tray frame, the back portion of the given tray frame and the central back storage space being disposed longitudinally sequentially in the dual-action storage media chassis structure from the front end thereof to a back end thereof, such that the second operating temperature is superior to the first operating temperature, and the third operating temperature is superior to the second operating temperature.

2. The dual-action storage media chassis structure of claim 1, wherein each dual-action slide assembly is adapted to latch the respective tray frame in any one of the first and second withdrawn positions.

3. The dual-action storage media chassis structure of claim 1, wherein each dual-action slide assembly is adapted to lock the respective tray frame in the received positions.

4. A dual-action storage media chassis system, comprising: a chassis including: a partition corridor defined by two inner slide walls longitudinally extending in the chassis; two storage spaces and two chain storage spaces symmetrically disposed on both sides of the partition corridor, respectively; and a central back storage space located between the chain storage spaces accommodating a processor unit having a third operating temperature; two storage media modules accommodated respectively in the two storage spaces, each storage media module including: a tray frame, each tray frame including a top access opening; and an extension having guiding structures extended along a side opposite to the corresponding inner side wall and connected to a chain structure formed by hollow passages; a cable is connected to the processor unit through the guiding structures and the hollow passages and received in the chain storage space; a first plurality of storage media arranged into a front portion of the tray frame through the top access opening, each one of the first plurality of storage media having a first operating temperature; a second plurality of storage media arranged into a back portion of the tray frame through the top access opening, each one of the second plurality of storage media having a second operating temperature; the first and the second pluralities of storage media being electrically coupled to the processor unit, the front portion of the tray frame, the back portion of the tray frame and the central back storage space being disposed longitudinally sequentially in the dual-action storage media chassis system, such that the second operating temperature is superior to the first operating temperature, and the third operating temperature is superior to the second operating temperature; and two dual-action slide assemblies for longitudinally and slideably moving the respective tray frames between a received position, a first withdrawn position and a second withdrawn position, each dual-action slide assembly including a corresponding one of the two inner slide walls and a respective inner slide panel longitudinally extending in the chassis and attached to the respective tray frame, the corresponding one of the two inner slide walls adapted for slideably receiving the respective inner slide panel.

5. The dual-action storage media chassis system of claim 4, wherein the second plurality of storage media of a given storage media module is only accessible through the top access opening of the respective tray frame when the respective tray frame is in the second withdrawn position.

6. The dual-action storage media chassis system of claim 4, wherein the second plurality of storage media of a given storage media module is not accessible through the top access opening of the respective tray frame when the respective tray frame is in the first withdrawn position.

7. The dual-action storage media chassis system of claim 4, wherein the first plurality of storage media of a given storage media module is accessible through the top access opening of the respective tray frame when the respective tray frame is any one of the first and second withdrawn positions.

8. The dual-action storage media chassis system of claim 4, wherein each storage media module further includes a storage media combination frame attached to the respective tray frame and adapted for electrically coupling each one of the first plurality of storage media and of the second plurality of storage media arranged into the respective tray frame.

9. The dual-action storage media chassis system of claim 4, wherein the first plurality of storage media and the second plurality of storage media of a given storage media module are latched differently to the respective tray frame.

10. The dual-action storage media chassis system of claim 4, wherein the dual-action storage media chassis system further includes two guiding assemblies, each guiding assembly cooperating with the corresponding dual-action slide assembly for moving the respective tray frame between the received position, the first withdrawn position and the second withdrawn position.

11. The dual-action storage media chassis system of claim 4, wherein the first operating temperature is 50 degrees Celsius, the second operating temperature is 70 degrees Celsius and the third operating temperature is 95 degrees Celsius.

12. The dual-action storage media chassis system of claim 4, wherein each dual-action slide assembly is adapted to latch the respective tray frame in any one of the first and second withdrawn positions.

* * * * *